(12) United States Patent
Nagamatsu et al.

(10) Patent No.: US 8,153,186 B2
(45) Date of Patent: Apr. 10, 2012

(54) PACKAGING BOARD AND MANUFACTURING METHOD THEREFOR, SEMICONDUCTOR MODULE AND MOBILE APPARATUS

(75) Inventors: Masayuki Nagamatsu, Gifu (JP); Ryosuke Usui, Aichi (JP)

(73) Assignee: Sanyo Eletric Co., Ltd., Osaka (JP)

( * ) Notice: Subject to any disclaimer, the term of this patent is extended or adjusted under 35 U.S.C. 154(b) by 419 days.

(21) Appl. No.: 12/541,407

(22) Filed: Aug. 14, 2009

(65) Prior Publication Data
US 2009/0304910 A1    Dec. 10, 2009

Related U.S. Application Data

(62) Division of application No. 11/937,208, filed on Nov. 8, 2007, now Pat. No. 7,595,553.

(30) Foreign Application Priority Data

| Nov. 8, 2006 | (JP) | 2006-302443 |
| Oct. 23, 2007 | (JP) | 2007-275739 |
| Nov. 8, 2007 | (JP) | 2007-290839 |

(51) Int. Cl.
*H05K 3/00* (2006.01)
(52) U.S. Cl. ............ 427/97.3; 427/97.4; 427/97.5; 29/846; 29/847
(58) Field of Classification Search ............ 427/96.1, 427/97.1, 97.3, 97.4, 97.5; 29/846, 847
See application file for complete search history.

(56) References Cited

U.S. PATENT DOCUMENTS

| 6,670,215 B2 | 12/2003 | Miyazaki et al. |
| 7,045,460 B1 * | 5/2006 | Weng et al. .......... 438/671 |
| 7,157,794 B2 | 1/2007 | Mori |
| 7,196,426 B2 | 3/2007 | Nakamura et al. |
| 7,340,829 B2 | 3/2008 | Wang |
| 7,399,399 B2 * | 7/2008 | Chou et al. .......... 205/126 |
| 7,411,304 B2 | 8/2008 | Kirby et al. |
| 7,501,584 B2 | 3/2009 | Hashimoto et al. |
| 7,595,553 B2 * | 9/2009 | Nagamatsu et al. .......... 257/731 |
| 7,718,470 B2 * | 5/2010 | Hsu .......... 438/106 |

(Continued)

FOREIGN PATENT DOCUMENTS

JP    2002-016183    1/2002

(Continued)

*Primary Examiner* — Mary Wilczewski
(74) *Attorney, Agent, or Firm* — Fish & Richardson P.C.

(57) ABSTRACT

An advantage of the present invention is to suppress moisture infiltrating from a pad electrode portion from spreading over the surface of a wiring pattern and improve the reliability of a packaging board. The wiring pattern of the packaging board is formed on an insulating substrate and includes a wiring region, an electrode region (pad electrode) connected with a semiconductor device, and a boundary region provided between the wiring region and the electrode region. A gold plating layer is provided on the surface of the electrode region of the wiring pattern. The top surface of the boundary region of the wiring pattern is so formed as to be dented from the top surface of the wiring region of the wiring pattern, and there is provided a stepped portion in the boundary region. A solder resist is formed in such a manner as to cover part of the gold plating layer and the wiring pattern corresponding to the boundary region and the wiring region, and the solder resist has a predetermined opening through which to connect to the semiconductor device. A conductive member is connected to the gold plating layer in the electrode region, and a molded resin layer seals the entire semiconductor module.

6 Claims, 14 Drawing Sheets

U.S. PATENT DOCUMENTS

| | | |
|---|---|---|
| 2001/0050431 A1 | 12/2001 | Naitoh et al. |
| 2003/0127747 A1 | 7/2003 | Kajiwara et al. |
| 2006/0226536 A1 | 10/2006 | Karnezos |
| 2008/0136033 A1* | 6/2008 | Nagamatsu et al. .......... 257/758 |
| 2009/0091031 A1 | 4/2009 | Takahashi et al. |
| 2009/0096099 A1* | 4/2009 | Hsu .............................. 257/738 |
| 2009/0294962 A1* | 12/2009 | Hsu .............................. 257/738 |
| 2009/0304910 A1* | 12/2009 | Nagamatsu et al. ......... 427/96.2 |
| 2010/0218983 A1* | 9/2010 | Furuta et al. .................. 174/257 |

FOREIGN PATENT DOCUMENTS

| | | |
|---|---|---|
| JP | 2004-165238 | 6/2004 |
| JP | 2006-073761 | 3/2006 |
| JP | 2006-114706 | 4/2006 |

* cited by examiner

PACKAGING BOARD AND MANUFACTURING METHOD THEREFOR, SEMICONDUCTOR MODULE AND MOBILE APPARATUS

CROSS-REFERENCE TO RELATED APPLICATION(S)

This application is a divisional of U.S. Ser. No. 11/937,208, filed Nov. 8, 2007, which in turn claims the benefit of priority from Japanese Patent Application No. 2006-302443, filed on Nov. 8, 2006, Japanese Patent Application No. 2007-275739, filed on Oct. 23, 2007, and Japanese Patent Application No. 2007-290839, filed on Nov. 8, 2007.

BACKGROUND OF THE INVENTION

1. Field of the Invention

The present invention relates to a packaging board and, more particularly, to a packaging board having pad electrodes.

2. Description of the Related Art

Portable electronic devices, such as mobile phones, PDAs, DVCs, and DSCs, are today gaining an increasing variety of functions. And to be accepted by the market, they have to be smaller in size and lighter in weight, and for that reason, there is a growing demand for highly-integrated system LSIs. On the other hand, these electronic devices are expected to be easier or handier to use, and therefore the LSIs used in those devices are required to be more functionally sophisticated and better performing. Thus the higher integration of LSI chips is causing increases in I/O count, which in turn generate demand for smaller packages. To satisfy both these requirements, it is strongly expected that semiconductor packages just right for the high board density packaging of semiconductor parts be developed. In response to such expectations, a variety of packaging technology called CSP (Chip Size Package) are being developed.

BGA (Ball Grid Array) is known as an example of such packaging. In a BGA package, a semiconductor chip is mounted on a substrate for packaging, and after it is resin-molded, solder balls are formed as external terminals in an area array on the opposite face.

FIG. 13 is a schematic cross-sectional view of a conventional BGA-type semiconductor module. This semiconductor device has a semiconductor device 106 mounted on one face of a circuit board 110 and solder balls 112, as external connection terminals, bonded to the other face thereof. Provided on one face of the circuit board 110 is a wiring pattern 103 (pad electrode portion 103a) to be electrically connected to the semiconductor device 106, and provided on the other face thereof is a land portion 103 that bonds the external connection terminal. The wiring pattern 103 and the land portion 103b are electrically coupled through a conductive part provided in the inner wall of a through hole 111 penetrating an insulating substrate 101. A solder resist 105 protects the surface of the circuit board 110. The circuit board 110 is sealed on one face with a molded resin layer 108 after the semiconductor device 106 is mounted thereon.

FIG. 14 is an enlarged sectional view of a pad electrode portion (sectional area indicated by X in FIG. 13) of a semiconductor device as shown in FIG. 13. The pad electrode portion 103a, which is connected by a wire 107, such as gold wire, to a semiconductor device 106, includes a wiring part made of copper and a gold plating layer 104 covering the surface thereof. The solder resist 105 is provided in such a manner as to cover the copper wiring part of the pad electrode portion 103a and also part of the gold plating layer 104. Openings in the solder resist 105 are sealed together with the semiconductor element 106 by the molded resin layer 108 after the semiconductor device 106 is mounted and wire connection and the like are provided.

This construction and arrangement, however, has a problem. The solder resist 105 and the molded resin layer 108, which can prevent external moisture from permeating themselves, cannot prevent moisture from infiltrating along their boundaries. Particularly since the gold plating layer 104 is flat and smooth, the structure can allow moisture to reach the wiring pattern 103 through its interface with the solder resist 105. For this reason, more moisture tends to be found in the part of the wiring pattern 103 near the gold plating layer 104. If the moisture having thus infiltrated further spreads over the surface of the wiring pattern 103, copper ions, which have leaked out from the part of the wiring pattern 103 where a plus voltage is applied during the operation of the semiconductor module, travel along the interface between the insulating substrate 101 and the solder resist 105 and separate out to the part of the wiring pattern 103 where a minus voltage is applied. This so-called ion migration can cause a problem of shorting (dielectric breakdown). This problem presents a great obstacle to improving the reliability of conventional semiconductor modules.

SUMMARY OF THE INVENTION

The present invention has been made in view of the foregoing circumstances, and a general purpose thereof is to provide a technology for improving the reliability of a packaging board by preventing moisture entering from the pad electrode portion from spreading over the surface of the wiring pattern.

One embodiment of the present invention relates to a packaging board adapted to mount an electronic device. This packaging board comprises: a wiring layer, made of copper, which contains a wiring region, an electrode region and a boundary region positioned between the wiring region and the electrode region, the wiring layer having a stepped portion in the boundary region; a gold plating layer formed on a surface of the electrode region in the wiring layer; and an insulating layer formed in such a manner as to cover part of the gold plating layer and the boundary region and the wiring region in the wiring layer, the insulating layer having a predetermined opening in the electrode region. Here, an electrode in the electrode region indicates a pad electrode provided on a circuit substrate such as a package substrate or a module substrate, or a pad electrode provided on a semiconductor device as typified by an LSI chip. With this electrode, a packaging board and a semiconductor device as typified as an LSI chip are wire-bonded or the packaging board and an external semiconductor device are wire-bonded together.

According to this embodiment, the moisture infiltrating via the interface between the gold plating layer and the insulating layer and spreading over the surface of the wiring layer has a longer distance of spreading than a conventional structure without the stepped portion. As a result, the supply of moisture to the wiring layer in the wiring region is restricted, thus making ion migration between wiring patterns hard to occur. Consequently, the reliability of the packaging board can be improved.

In the above embodiment, the stepped portion is preferably formed in such manner that it is positioned lower than a top surface of the wiring region. With this structure, moisture is more likely to collect at the bottom part of the stepped portion, and thus the stepped portion acts as a barrier to the infiltrating moisture. This further restricts the spread of moisture from the boundary region to the wiring region of the wiring pattern. Consequently, the reliability of the packaging board can be further improved.

In the above embodiment, a surface of the wiring layer in contact with insulating layer in the boundary region is preferably roughened. In such a case, the surface of the wiring layer in the boundary region has fine asperities. Hence, the distance of infiltrating moisture spreading over the surface of the wiring pattern is longer, thus restricting the spread of moisture. Also, the fine unevenness provided on the surface of the wiring pattern improves the adhesion of the part to the insulating layer, which makes it harder for the infiltrating moisture to spread along the interface between the wiring layer in the boundary region and the insulating layer. As a result of these, the spread of moisture from the boundary region to the wiring region of the wiring layer is further restricted. Consequently, the reliability of the semiconductor module can be further improved.

In the above embodiment, the wiring layer and the insulating layer may be formed on a substrate; the wiring layer may have a gap between the wiring layer and the substrate along an edge at a side of the wiring layer in contact with the substrate; and the insulating layer may be so formed as to fill in the gap. By implementing this structure, the anchor effect of the insulating layer filling up the gap improves the adhesion between the wiring layer and the insulating layer, thus making it harder for infiltrating moisture to spread over the surface of the wiring layer in the wiring region. As a result, the reliability of the packaging board can be further improved.

Another embodiment of the present invention relates to a semiconductor module. This semiconductor module comprises: a packaging board according to any one of the above-described embodiments; and a semiconductor device mounted on the packaging board. In this embodiment, the semiconductor module may be connected to the packaging board by wire-bonding. Also, the semiconductor device may be flip-chip connected to the packaging board.

Still another embodiment of the present invention relates to a portable apparatus. This portable apparatus is equipped with a semiconductor module according to any one of the above-described embodiment.

Still another embodiment of the present invention relates to a method for manufacturing a packaging board adapted to mount an electronic device. The method for manufacturing a packaging board comprises: a process of forming a first metal layer on a substrate; a process of forming a wiring having an electrode region, a wiring region and a boundary region provided between the electrode region and the wiring region, by patterning the first metal layer; a process of forming a second metal layer on a surface of the wiring and the substrate; a process of forming a mask on the substrate in a manner such that the second metal layer is partially exposed on the electrode region, the boundary region and a predetermined region in the periphery of the electrode region and the boundary region; a process of making a surface of the boundary region lower than that of the wiring region, using the first mask, by removing the wiring layer corresponding to the electrode region and the boundary region after selectively removing the second metal layer in the electrode region, the boundary region and the predetermined region in the periphery of the electrode region and the boundary region by use of the first mask; a process of removing the first mask; a process of forming a second mask on the substrate in a manner such that the wiring in the electrode region and the substrate in a predetermined region in the periphery of the electrode region are exposed; a process of forming a gold plating layer in the electrode region with the second metal layer used as a lead; a process of removing the second mask and the second metal layer; and a process of covering part of the electrode region and the wiring layer in the boundary region and the wiring region with an insulating layer.

In the method for manufacturing a packaging board according to the above embodiment, the first metal layer may be formed by using an electroless plating method and an electrolytic plating method. Also, the second metal layer may be formed by using an electroless plating method. Also, the gold plating layer may be an Au/Ni layer or an Au/Pd/Ni layer.

The method for manufacturing a packaging board according to the above embodiment may further comprise a process of roughening a surface of the wiring after forming the wiring.

In the method for manufacturing a packaging board according to the above embodiment, the insulating layer may be formed after providing a gap between the wiring and the substrate along edges of a bottom of the wiring in an area where the insulating layer is covered.

It is to be noted that any arbitrary combinations or rearrangement of the aforementioned structural components and so forth are all effective as and encompassed by the embodiments of the present invention.

Moreover, this summary of the invention does not necessarily describe all necessary features so that the invention may also be sub-combination of these described features.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

Figure 1:
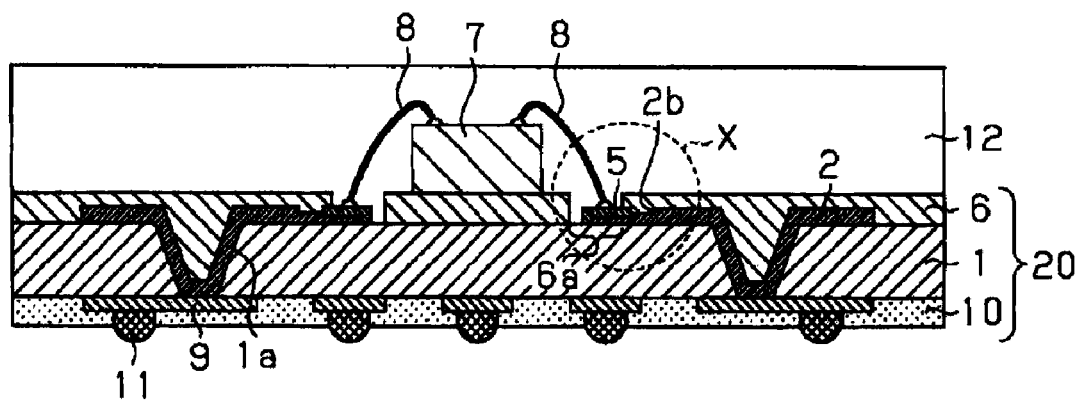
FIG. 1 is a schematic cross-sectional view showing a semiconductor module having a pad electrode according to a first embodiment of the present invention.

The invention will now be described by reference to the preferred embodiments. This does not intend to limit the scope of the present invention, but to exemplify the invention.

Hereinbelow, the embodiments will be described with reference to the accompanying drawings. Note that in all of the Figures the same reference numerals are given to the same components and the description thereof is omitted as appropriate.

First Embodiment

Figure 2:
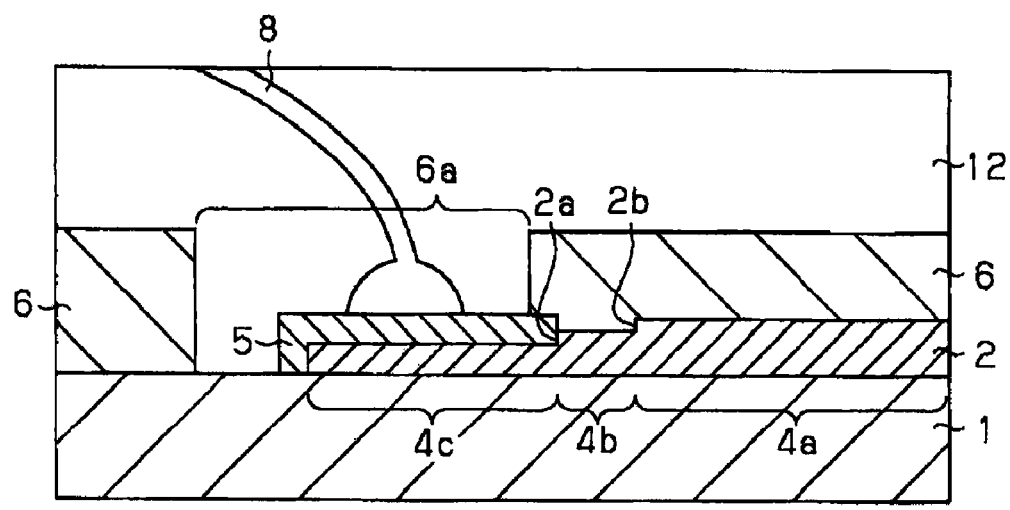
FIG. 2 is an enlarged cross-sectional view of a pad electrode portion of a semiconductor module shown in FIG. 1.
Figure 3:
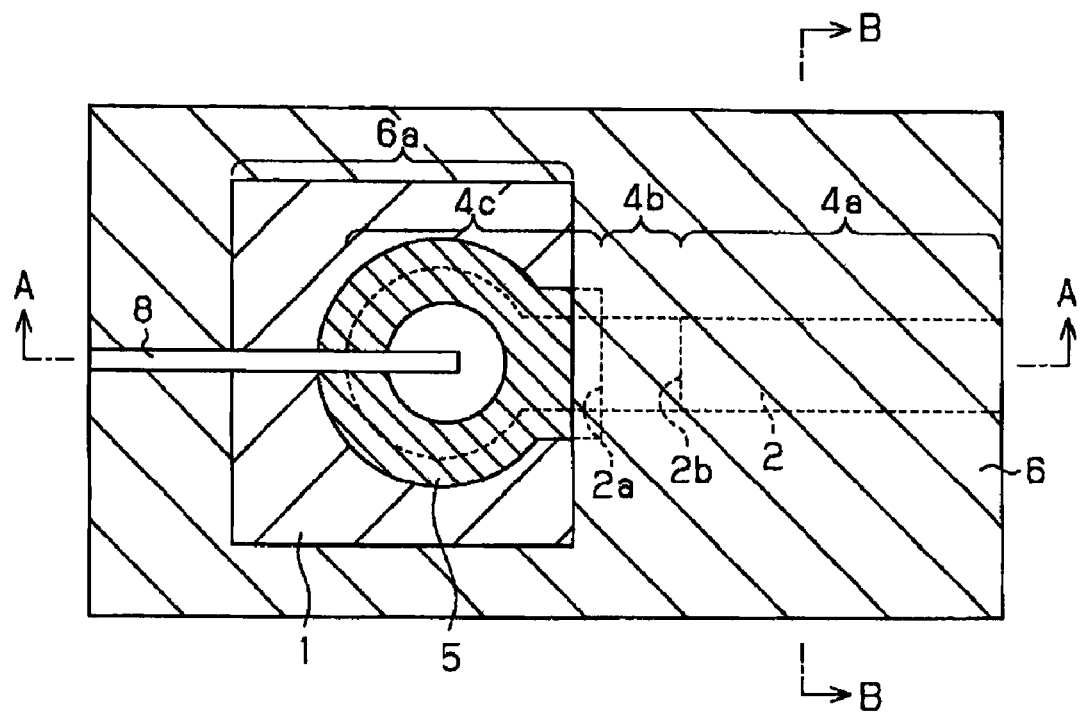
FIG. 3 is an enlarged top view of a pad electrode portion of a semiconductor as shown in FIG. 1.

FIG. 1 is a schematic cross-sectional view showing a semiconductor module having a pad electrode according to a first embodiment of the present invention. FIG. 2 is an enlarged sectional view of a pad electrode portion (sectional area indicated by X in FIG. 1) of a semiconductor module shown in FIG. 1, and FIG. 3 is a schematic top view of a pad electrode portion of a semiconductor as shown in FIG. 1. Note that FIG. 2 is a cross section taken along the line A-A of FIG. 3.

A semiconductor module according to the first embodiment has a semiconductor device 7 mounted on the upper face of a packaging board 20 and solder balls 11, as external connection terminals, bonded to the lower face thereof. Provided on upper face of the packaging board 20 is a wiring pattern 2 of copper connected electrically to the semiconductor device 7, and provided on the lower face thereof is a wiring pattern 9 of copper to which external connection terminals are bonded. The wiring pattern 2 and the wiring pattern 9 are electrically coupled through a conductive part provided on the inner wall of a via hole 1a penetrating an insulating substrate 1. The wiring pattern 2 has an electrode region 4c, having a gold plating layer 5 formed on the surface thereof, and a stepped portion 2b, and is connected to the semiconductor device 7 via a conductive member 8 in the electrode region 4c thereof. A solder resist 6 and a solder resist 10 protect their respective surfaces of the wiring pattern 2 and the wiring pattern 9. The packaging board 20 is sealed on the upper face with a molded resin layer 12, and the semiconductor device 7 mounted on the packaging board 20 is sealed entirely with the molded resin layer 12.

More specifically, as shown in FIG. 2, the wiring pattern 2 is formed on an insulating substrate 1 which functions as a core base material. The wiring pattern 2 is comprised of a wiring region 4a where circuit wiring, connection between upper and lower wirings and the like are installed, an electrode region (pad electrode portion) 4c where connection is made with the semiconductor device 7, and a boundary region 4b which is provided between the wiring region 4a and the electrode region 4c. The electrode region 4c of the wiring pattern 2 has a gold plating layer 5 provided on the surface thereof. The upper face of the wiring pattern in the boundary region 4b is so formed as to be dented, or lower than the upper face of the wiring pattern in the wiring region 4a, and a stepped portion 2b is provided in the boundary region 4b. The stepped portion 2b, as shown in FIG. 3, is provided in such a manner as to traverse the wiring pattern 2. The solder resist 6 is so formed as to cover part of the gold plating layer 5 and the wiring pattern in the boundary region 4b and the wiring region 4a, and has a predetermined opening 6a that allows connection to the semiconductor device 7. A conductive member 8 is connected to the gold plating layer 5 in the electrode region 4c, and all the above-described structure is sealed by the molded resin layer 12.

It is to be noted that the wiring pattern 2 is an example of a "wiring layer", the wiring region 4a is an example of a "wiring region", the boundary region 4b is an example of a "boundary region", the electrode region 4c is an example of an "electrode region", the gold plating layer 5 is an example of a "gold plating layer", the solder resist 6 is an example of an "insulating layer", and the stepped portion 2b is an example of a "stepped portion".

(Manufacturing Method)

FIGS. 4A to 4D, 5A to 5D and 6A to 6C are schematic cross-sectional views for explaining a manufacturing process of a pad electrode portion of a packaging board shown in FIG. 2. Now a description will be given of a manufacturing process of a pad electrode portion of a packaging board according to a first embodiment by referring to FIG. 2 and FIGS. 4A to 6C.

Figure 4A:
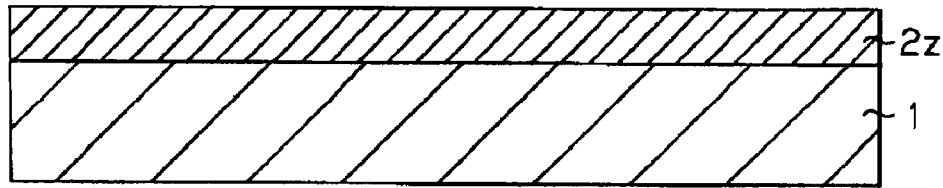
FIGS. 4A to 4D are cross-sectional views for explaining a manufacturing process of a pad electrode portion of a semiconductor module according to a first embodiment of the present invention.

Firstly, as illustrated in FIG. 4A, a wiring layer 2z of copper, in a thickness of about 20 μm, is formed on an insulating substrate 1, which functions as a core substrate, using an electroless plating method and an electrolytic plating method.

As the insulating substrate 1, a film containing an epoxy resin as a main ingredient is used, and the thickness thereof is, for instance, about 100 μm. From the viewpoint of improving the heat radiation of the packaging board, it is preferable that the insulating substrate 1 has a high thermal conductivity. In this respect, it is desirable that the insulating substrate 1 contains, as a high thermal conductive filler, silver, bismuth, copper, aluminum, magnesium, tin, zinc, or an alloy thereof, or silica, alumina, silicon nitride, aluminum nitride, or the like. In the present embodiment, the insulating substrate 1 is provided with via holes 1a as shown in FIG. 1, but this is omitted in the present description of the manufacturing method.

Figure 4B:
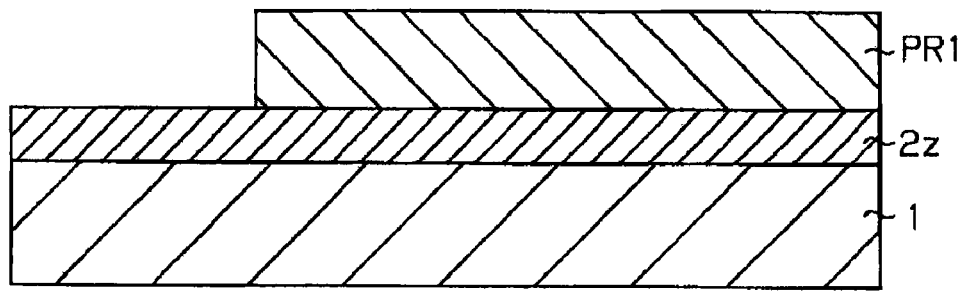

As illustrated in FIG. 4B, a resist mask PR1 having a predetermined pattern is formed on the wiring layer 2z, using a photolithography technique.

Figure 4C:
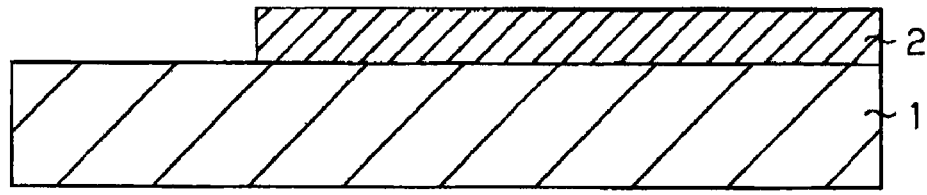

As illustrated in FIG. 4C, after the wiring layer 2z is patterned by a wet etching technique using ferric chloride, the resist mask PR1 is removed by a wet process. After that, a chemical cleaning is performed to strip off residues and the like that have occurred at the ashing. As a result, the wiring pattern 2 having a predetermined circuit wiring is formed.

Figure 4D:
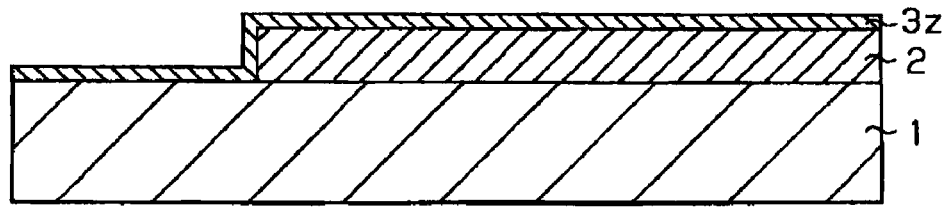

As illustrated in FIG. 4D, a copper thin film 3z, in a thickness of about 1 μm, is formed on the whole surface of the insulating substrate 1 including the wiring pattern 2, using an electroless plating method.

Figure 5A:
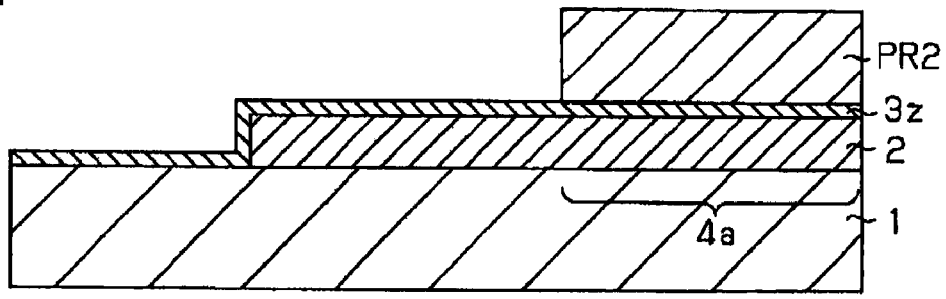
FIGS. 5A to 5D are cross-sectional views for explaining a manufacturing process of a pad electrode portion of a semiconductor module according to a first embodiment of the present invention.

Next, as illustrated in FIG. 5A, a resist mask PR2 having a predetermined pattern is formed on the copper thin film 3z, using a photolithography technique. At this time, the resist mask PR2 is not formed on the copper thin film 3z in the electrode region 4c and the boundary region 4b.

Figure 5B:
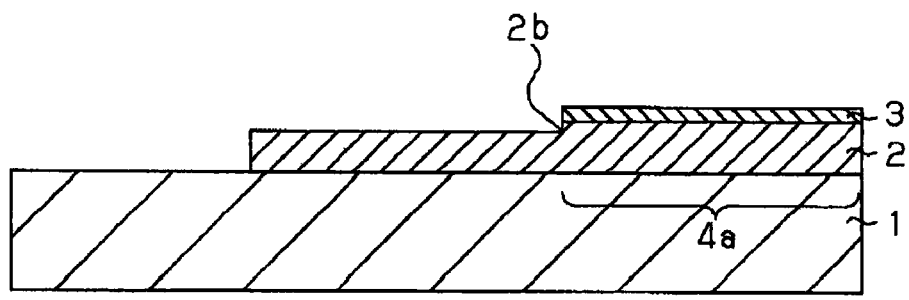

As illustrated in FIG. 5B, after the copper thin film 3z is patterned by an etching technique, the resist mask PR2 is stripped off by a wet process. At this time, the surface of the wiring pattern 2 in the boundary region 4b is also etched. Thus the upper face of the wiring pattern 2 in the boundary region 4b is dented lower than the upper face of the wiring pattern 2 in the wiring region 4a, and a stepped portion 2b (level difference: about 1 μm) corresponding to the thickness of the copper thin film 3 is formed in the boundary region 4b. Formed as a result is a copper thin film 3 which is used in supplying power to the wiring pattern as a whole when a gold plating layer 5 is plated in a subsequent process. In other words, the copper film 3 is used as a plating lead when the gold plating layer is formed.

Figure 5C:
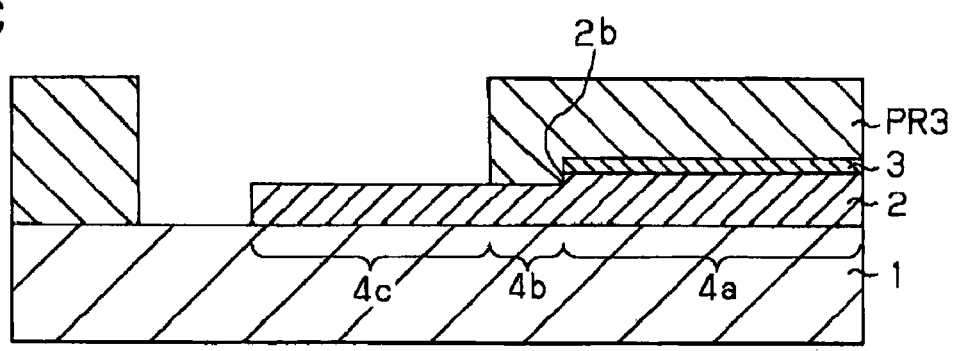

As illustrated in FIG. 5C, a resist mask having resistance to gold plating PR3 having an opening is formed in a part including the electrode region 4c of the wiring pattern 2, using a photolithography technique. As a result, the boundary region 4b is covered with the gold-resistant resist mask PR3.

Figure 5D:
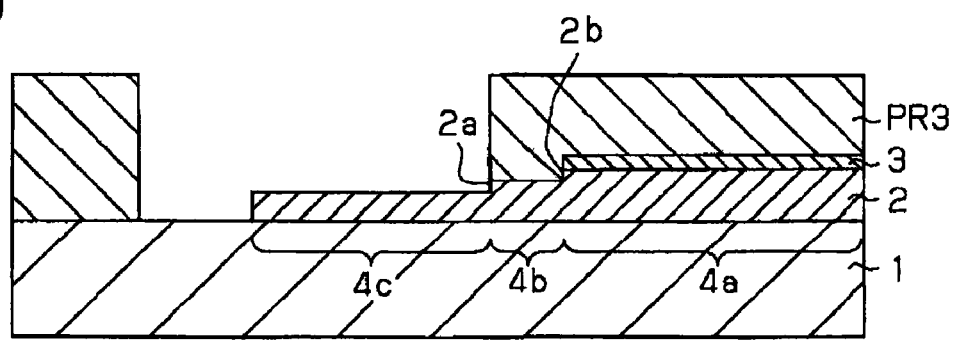

As illustrated in FIG. 5D, a stepped portion 2a is formed by applying about 5 μm of soft etching to the surface of the copper thin film 3, using an etching technique. This makes it possible to reduce the thickness (height) of wiring in the pad electrode portion (electrode region 4c) when the gold plating layer 5 is formed in a subsequent process.

Figure 6A:
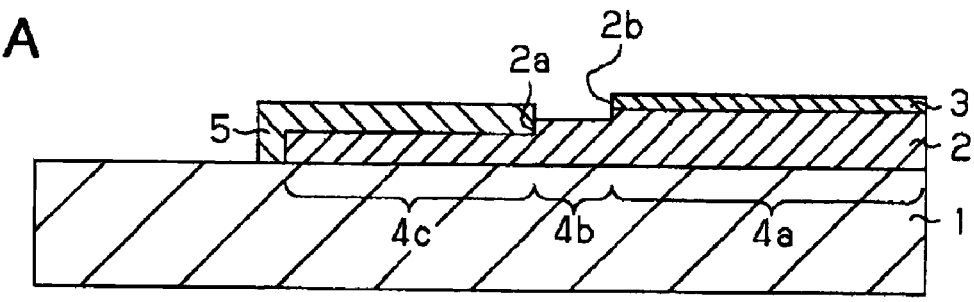
FIGS. 6A to 6C are cross-sectional views for explaining a manufacturing process of a pad electrode portion of a semiconductor module according to a first embodiment of the present invention.

Next, as illustrated in FIG. 6A, a gold plating layer (electrolytic Au/Ni plating film) 5, in a thickness of about 5.5 μm (about 0.5 μm/about 5 μm) is formed on the surface of the wiring pattern 2 in a predetermined region (electrode region 4c), using a selective plating method. After that, the resist mask having resistance to gold plating PR3 is stripped off by a wet process. As a result, the gold plating layer 5 is selectively formed on the surface of the wiring pattern 2 in the electrode region 4c. Note that the gold plating layer 5 is not limited to an Au/Ni layer and, for example, an Au/Pb/Ni layer may be used as the gold plating layer 5.

Figure 6B:
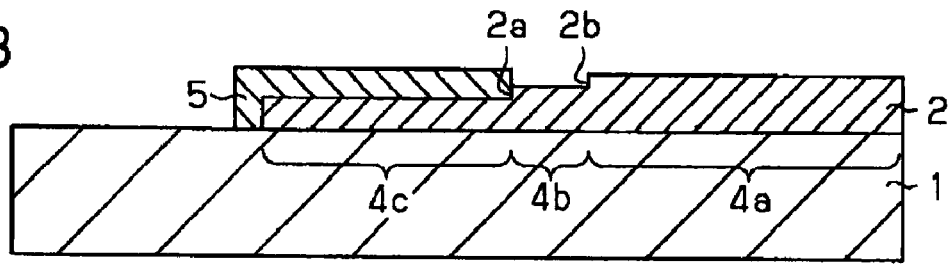

As illustrated in FIG. 6B, the copper thin film 3 is removed by etching the whole surface using an etching technique.

Figure 6C:
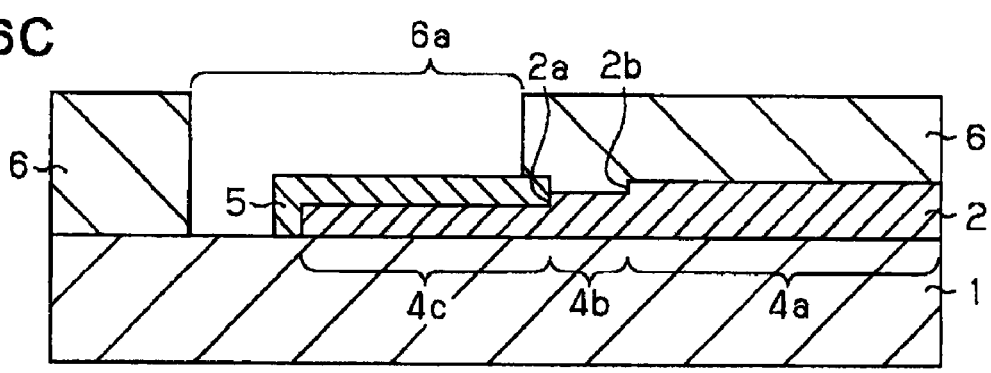

As illustrated in FIG. 6C, a solder resist 6, having a predetermined opening 6a therein, is formed in such a manner as to cover part of the gold plating layer 5 and the wiring pattern 2 in the boundary region 4b and the wiring region 4a. The solder resist 6 functions as a protective film for the wiring pattern 2.

Finally, as shown in FIG. 1, the conductive member 8 is wire-bonded to the gold plating layer 5 in the electrode region 4c of the wiring pattern 2. Here, a gold wire or the like is used as the conductive member 8. Then the molded resin layer 12, which seals the whole above-described area, is formed. The molded resin layer 12 is formed over the solder resist 6 in such a manner that it covers the entire surface of the semiconductor device 7 (see FIG. 1) and the electrode region 4c (gold plating layer 5) of the wiring pattern 2. The molded resin layer 12 protects the semiconductor device 7 against external influences. The material of the molded resin layer 12 is, for instance, an epoxy resin, which is a thermosetting insulating resin. Note also that a filler to raise thermal conductivity may be added to the molded resin layer 12.

Through the processes as described above, a packaging board (pad electrode portion of a packaging board) according to the first embodiment can be obtained.

The packaging board and the semiconductor module according to the first embodiment as described above presents advantageous effects as will be described below:

(1) The stepped portion 2b is provided in the boundary region 4b adjacent to the gold plating layer 5, so that the moisture infiltrating via the interface between the gold plating layer 5 and the solder resist 6 and spreading over the surface of the wiring pattern 2 has a longer distance of spreading than the conventional structure without the stepped portion. As a result, the supply (spread) of moisture to the wiring pattern 2 in the wiring region 4a is restricted, thus making ion migration between wiring patterns hard to occur. Consequently, the reliability of the semiconductor module as well as the packaging board can be improved.

(2) The stepped portion 2b is so formed that the upper face of the wiring pattern 2 in the boundary region 4b is dented, or lower than the upper face of the wiring pattern 2 in the wiring region 4a. As a result, moisture is more likely to collect at the bottom part of the stepped portion 2b, and thus the stepped portion 2b acts as a barrier to the infiltrating moisture. This further restricts the spread of moisture from the boundary region 4b to the wiring region 4a of the wiring pattern 2. Consequently, the reliability of the semiconductor module as well as the packaging board can be further improved.

(3) A recessed dent including the stepped portion 2b provided in the boundary region 4b on the surface of the wiring pattern 2 creates an anchor effect for the solder resist 6, which improves the adhesion between the wiring pattern 2 and the solder resist 6. This makes it harder for the infiltrating moisture to spread over the surface of the wiring pattern 2 in the boundary region 4b. Consequently, the reliability of the semiconductor module as well as the packaging board can be further improved.

(4) The stepped portion 2b, provided in the boundary region 4b adjacent to the gold plating layer 5, restricts the spread of moisture reliably near the source on moisture infiltration. This improves the reliability of the semiconductor module as well as the packaging board more effectively than when the stepped portion is provided within the wiring region 4a.

Second Embodiment

Figure 7A:
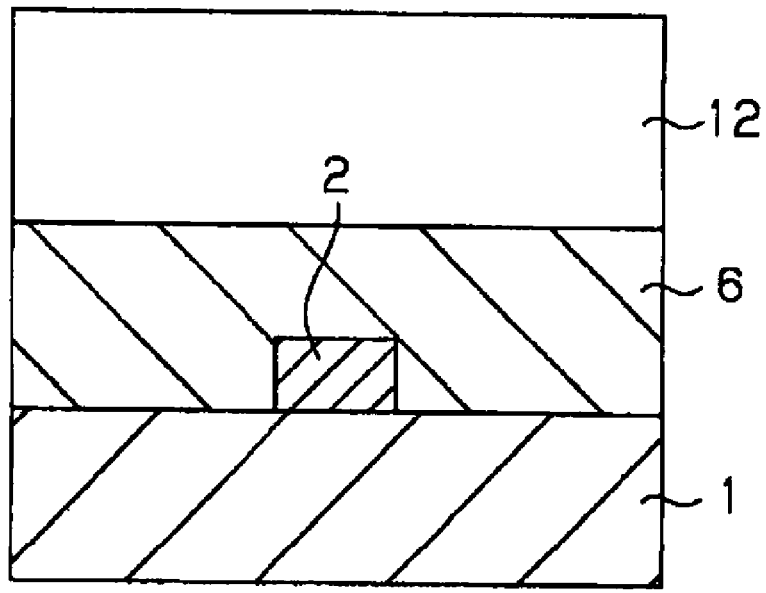
FIGS. 7A and 7B are cross-sectional views of wiring pattern portions of a semiconductor module according to a first and a second embodiment of the present invention.
Figure 7B:
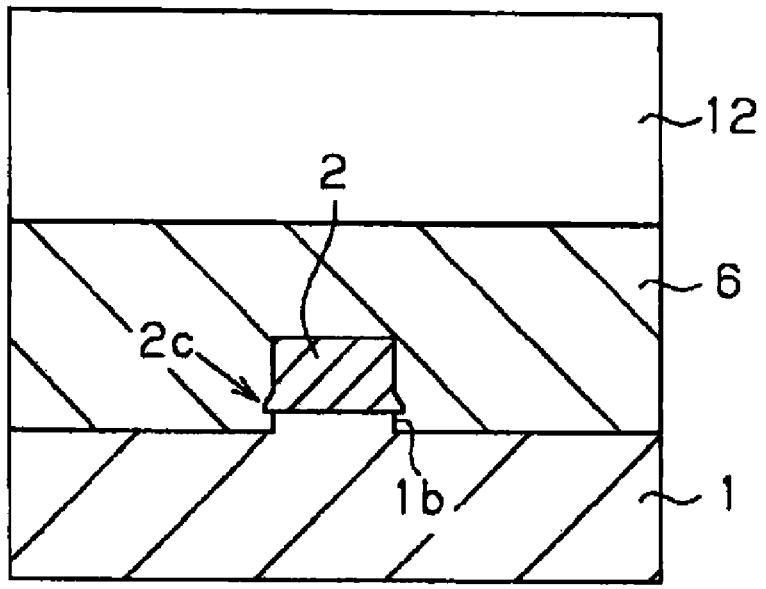

FIGS. 7A and 7B show cross sections taken along the line B-B of FIG. 3. FIG. 7A is a cross-sectional view of a semiconductor module according to the first embodiment, and FIG. 7B a cross-sectional view thereof according to a second embodiment of the present invention.

As illustrated in FIG. 7A, a wiring pattern 2 of a semiconductor module according to the first embodiment is a rectangular wiring pattern 2 formed on an insulating substrate 1 and sealed and covered by a solder resist 6. In contrast to this, a wiring pattern 2 of a semiconductor module according to the second embodiment has a skirt-shaped bottom 2c and is further provided with a gap 1b with the insulating substrate 1 along the edges of the skirt-shaped bottom 2c. Otherwise, the structure is the same as one of the first embodiment.

A semiconductor module, which has the gap 1b with the insulating substrate 1 along the edges of the skirt-shaped bottom 2c of the wiring pattern 2, can be produced by first forming the wiring pattern 2 into one with the skirt-shaped bottom 2c by controlling the etching conditions in the process shown in FIG. 4C and then isotropically etching the insulating substrate 1 by controlling the chemical treatment in the processes shown in FIG. 4C, FIG. 5B, and FIG. 6A. Note that the gap 1b can be easily filled up by solder resist 6 when the solder resist 6 is formed on the wiring pattern 2.

The semiconductor module according to the second embodiment presents the following advantageous effects in addition to the ones mentioned in (1) to (4) above:

(5) The wiring pattern 2 is provided with the gap 1b with the insulating substrate 1 along the edges on the side thereof coming in contact with the insulating substrate 1, and the solder resist 6 fills up the gap 1b. The anchor effect of the solder resist 6 filling up the gap 1 improves the adhesion between the wiring pattern 2 and the solder resist 6, thus making it harder for infiltrating moisture to spread over the surface of the wiring pattern 2 in the wiring region 4a. Consequently, the reliability of the semiconductor module can be further improved.

(6) The bottom of the wiring pattern 2 is skirt-shaped, and the gap 1b is provided underneath. Thus the distance of moisture traveling along the side of the wiring pattern 2 to the insulating substrate 1 side is longer than when the skirt-shaped bottom and the gap 1b are not provided. As a result, the supply of moisture is restricted, thus making ion migration between wiring patterns harder to occur. Consequently, the reliability of the semiconductor module is improved.

Third Embodiment

Figure 8:
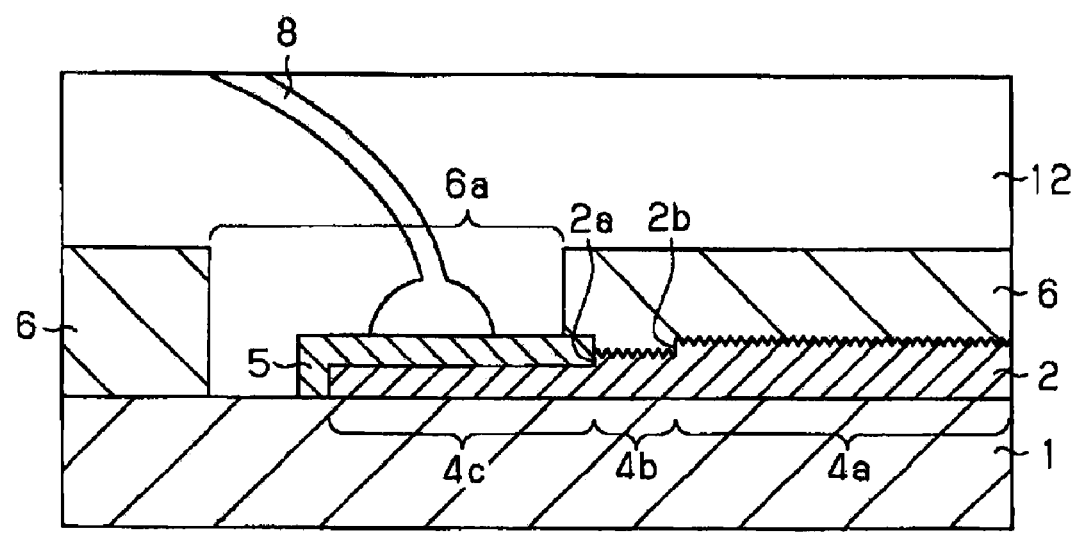
FIG. 8 is a cross-sectional view of a pad electrode portion of a semiconductor module according to a third embodiment of the present invention.

FIG. 8 is a cross-sectional view of a pad electrode portion of a semiconductor module according to a third embodiment of the present invention. The difference with the first embodiment lies in that the surface of the wiring pattern 2 in the boundary region 4b and the wiring region 4a is roughened. Otherwise, the structure is the same as that of the first embodiment.

A semiconductor like this can be easily produced by roughening the surface of the wiring pattern 2 of copper by a wet process or the like after the process shown in FIG. 6B. For example, a surface treatment using an acidic chemical can create a roughened surface with fine unevenness (fine asperities). Thus the surface of the wiring pattern 2 may be roughened with fine asperities. The arithmetic mean roughness Ra of the wiring pattern after the roughening is about 0.38 μm. The Ra of the surface of the wiring pattern 2 can be measured with a stylus type surface texture measuring instrument. Note that the roughening of the surface of the gold plating layer 5 does not result from this wetting with an acidic chemical. The Ra of the gold plating layer 5 is about 0.11 μm.

The semiconductor module according to the third embodiment presents the following advantageous effects in addition to the ones mentioned in (1) to (4) above:

(7) The surface of the wiring pattern 2 coming in contact with the solder resist 6 in the boundary region 4b is roughened, so that the surface of the wiring pattern 2 in the boundary region 4b has fine asperities. Hence, the distance of infiltrating moisture spreading over the surface of the wiring pattern 2 is longer, thus restricting the spread of moisture. Also, the fine unevenness provided on the surface of the wiring pattern 2 improves the adhesion of the part to the solder resist 6, which makes it harder for the infiltrating moisture to spread along the interface between the wiring pattern 2 in the boundary region 4b and the solder resist 6. This further restricts the spread of moisture from the boundary region 4b to the wiring region 4a of the wiring pattern 2. Consequently, the reliability of the semiconductor module can be further improved.

In the above-described embodiments, an example has been shown where the stepped portion 2b is formed by use of the forming and removal of the copper thin film 3, but this should not be considered as limiting. For instance, it may be so arranged that a resist mask is provided separately to form a stepped portion in the boundary region 4b using a photolithography technique, and a desired stepped portion is formed using an etching technique. In this case, too, the above-mentioned advantageous effects can be achieved.

In the above-described embodiments, an example of a pad electrode portion (electrode region 4c) provided on the packaging board 20 is presented, but the present embodiments are not limited thereto. For instance, the pad electrode portion may be one provided on a semiconductor device as typified by an LSI chip. In this case, too, the above-mentioned advantageous effects can be achieved.

In the third embodiment described above, an example of roughening by a wet process is shown, but the present embodiments are not limited thereto. For instance, the surface of the wiring pattern 2 may be roughened by a plasma process and the like. In this case, a surface treatment by a plasma irradiation using an argon gas, for instance, can create a roughened surface with fine asperities. Note that the roughening of the surface of the gold plating layer 5 does not result from this plasma process.

In the above-described embodiments, an example of the stepped portion 2b provided on the surface of the wiring pattern 2 in the boundary region 4b is presented, but it may be so arranged, for example, that the stepped portion is provided on the surface of the wiring pattern 2 in the wiring region 4a. In such a case, moisture infiltrating from the electrode region 4c is less likely to spread to the wiring region beyond the stepped portion, and thus the occurrence of ion migration between wiring patterns beyond the stepped portion will be restricted.

Fourth Embodiment

Figure 9:
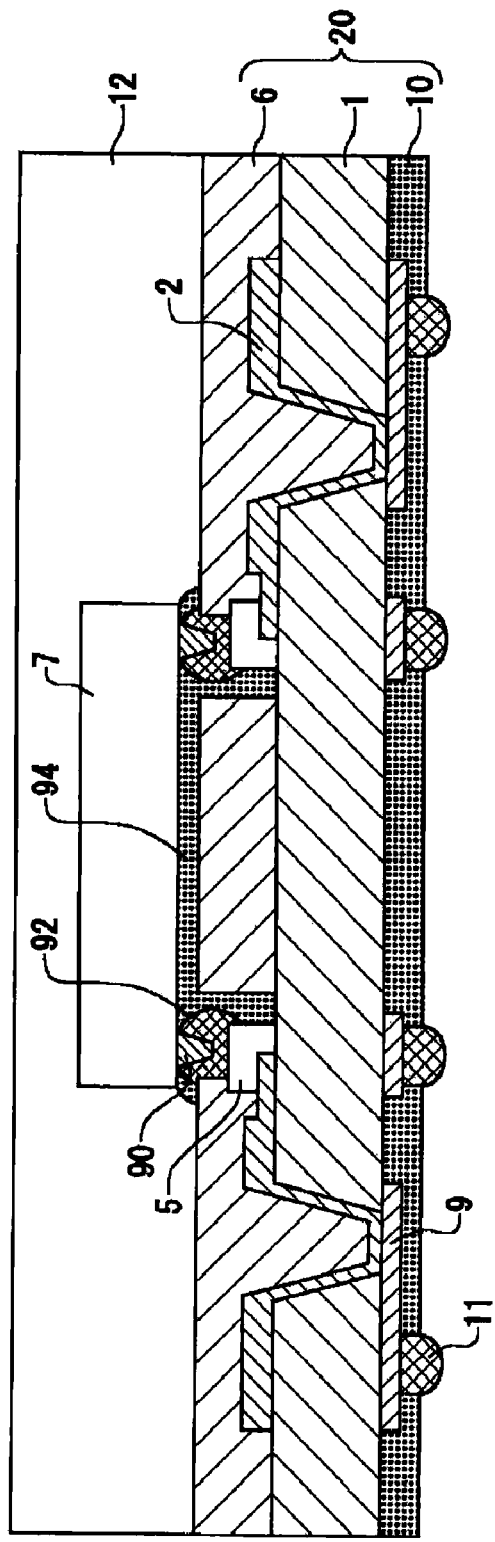
FIG. 9 is a schematic cross-sectional view showing a structure of a semiconductor module having a pad electrode according to a fourth embodiment of the present invention.
Figure 10:
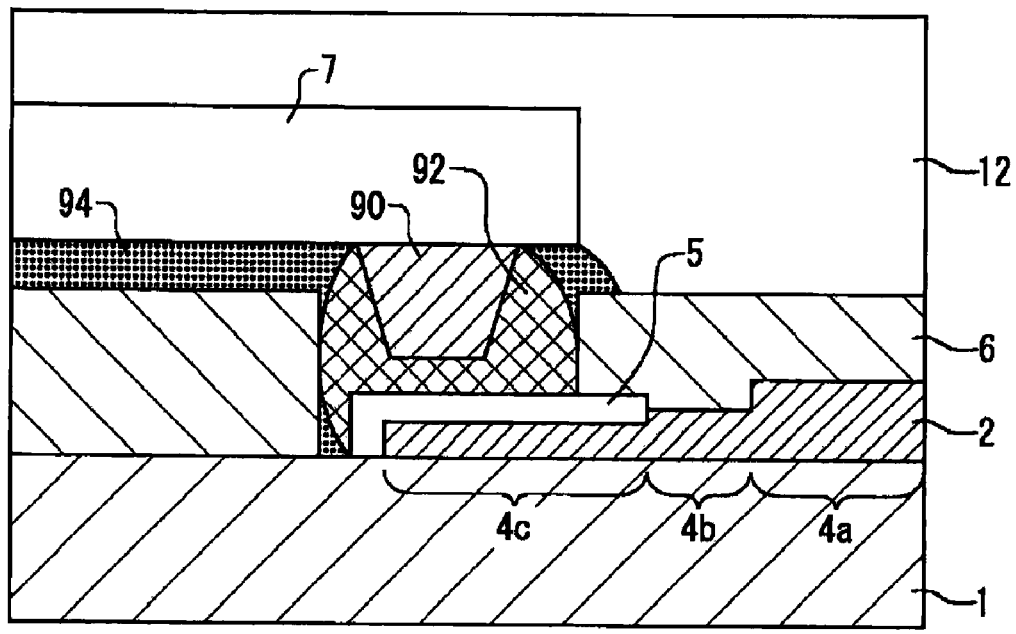
FIG. 10 is an enlarged cross-sectional view of a pad electrode portion of a semiconductor module shown in FIG. 9.

FIG. 9 is a schematic cross-sectional view showing a structure of a semiconductor module having a pad electrode according to a fourth embodiment of the present invention. FIG. 10 is an enlarged cross-sectional view of the pad electrode portion of a semiconductor module shown in FIG. 9. In a semiconductor module according to the first embodiment, the semiconductor device 7 is wire-bonded to the gold plating layer in the electrode region 4c of the wiring pattern 2, via the conducive member 8. In contrast thereto, in a semiconductor module according to the fourth embodiment a semiconductor device 7 is flip-chip connected to the packaging board 20. More specifically, an electrode forming surface of the semiconductor device 7 on which a bump 90 is formed is positioned downward, and a bump 90 is connected to a gold plating layer 5 in an electrode region 4c of a wiring pattern 2 by way of a solder 92. An underfill material 94 is filled in between the semiconductor device 7 and a solder resist 6.

The packaging board and the semiconductor module according to the fourth embodiment produce similar advantageous effects to those in the first embodiment:

(8) The bump 90, the solder 92 and the gold plating layer 5 are protected by the underfill material 94, so that connection reliability between the bump 90 and the gold plating layer 5 is improved. The underfill material 94 further restricts the supply (spread) of moisture to the wiring pattern 2 in the wiring region 4a, thus making ion migration between wiring patterns harder to occur.

Fifth Embodiment

Next, a description will be given of a mobile apparatus (portable device) provided with the above-described semiconductor module. The mobile apparatus presented as an example herein is a mobile phone, but it may be any electronic apparatus, such as a personal digital assistant (PDA), a digital video cameras (DVC) and a digital still camera (DSC).

Figure 11:
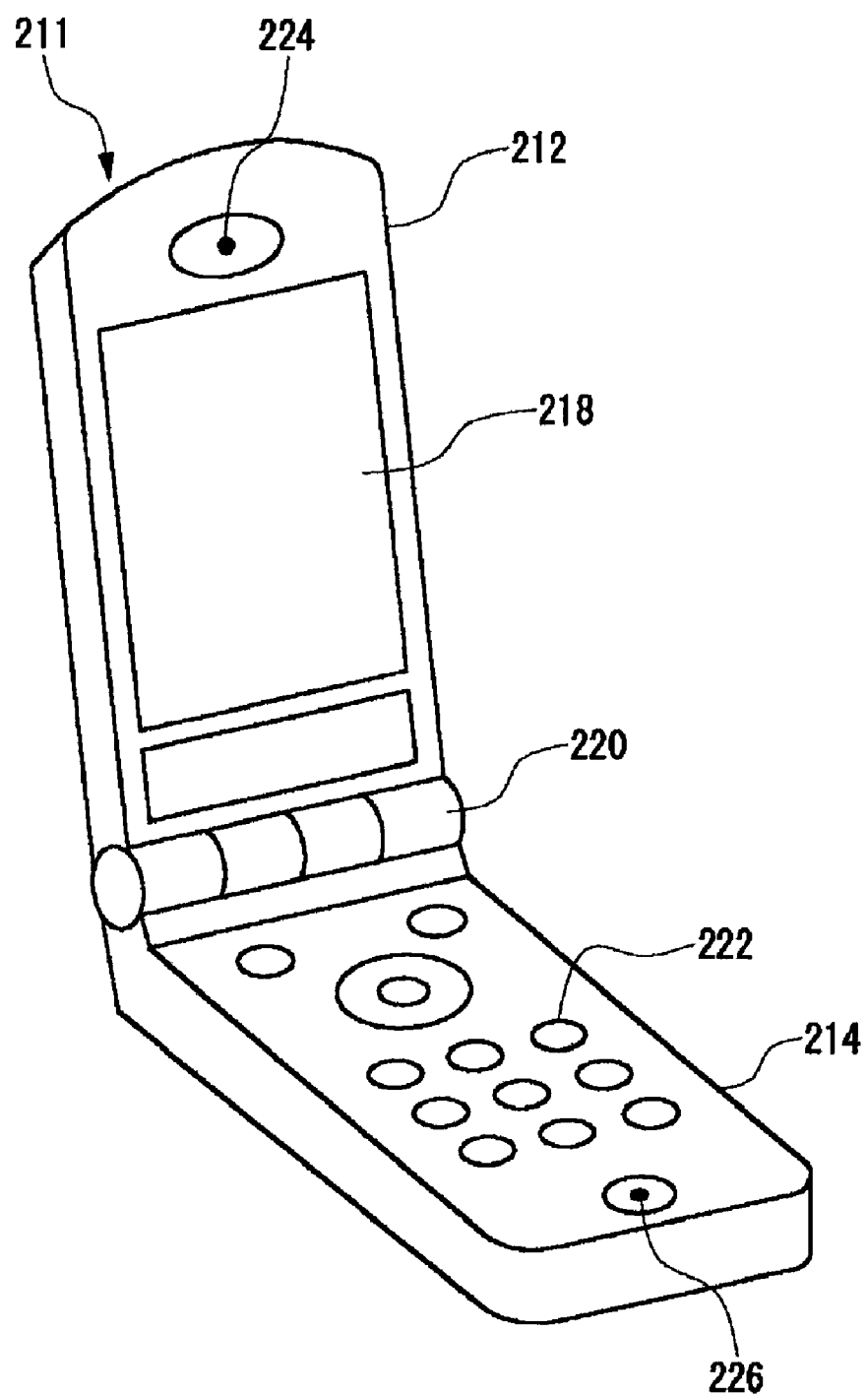
FIG. 11 illustrates a structure of a mobile phone provided with a semiconductor module according to a fifth embodiment of the present invention.

FIG. 11 illustrates a structure of a mobile phone provided with a semiconductor module according to a fifth embodiment of the present invention. A mobile phone 211 has a structure including a first casing 212 and a second casing 214 jointed together by a movable part 220. The first casing 212 and the second casing 214 are turnable/rotatable around the movable part 220 as the axis. The first casing 212 is provided with a display unit 218 for displaying characters, images and other information and a speaker unit 224. The second casing 214 is provided with a control module 222 with operation buttons and the like and a microphone 226. Note that a semiconductor module according to each of the above-described embodiments is mounted within a mobile phone 211 such as this.

Figure 12:
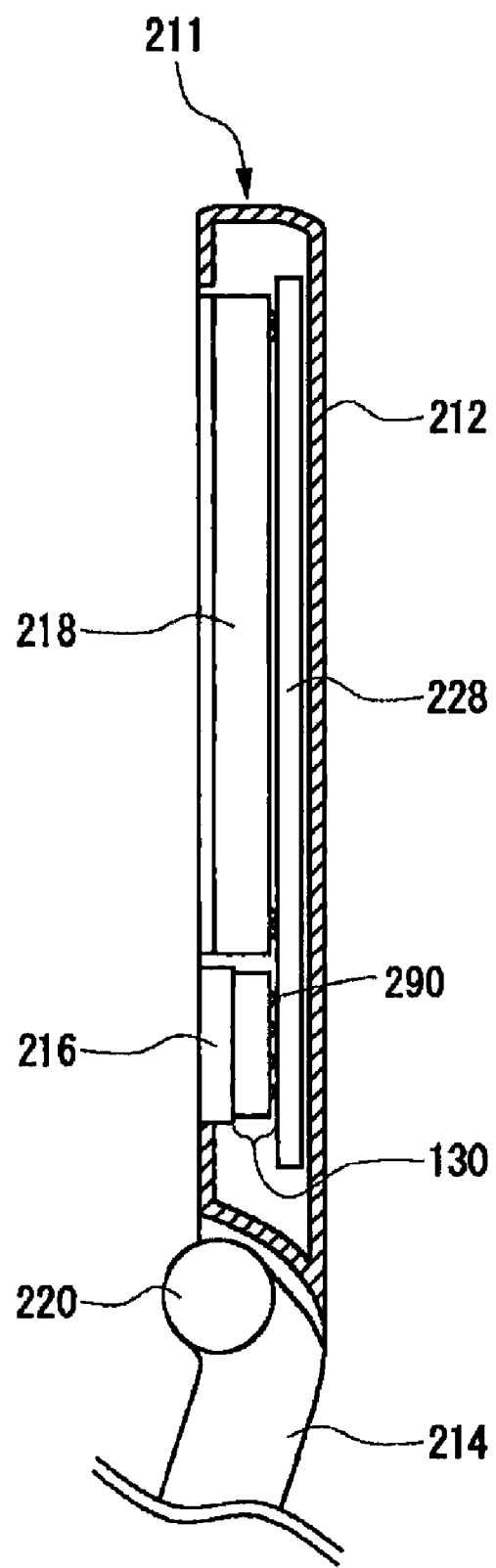
FIG. 12 is a partial cross-sectional view (cross-sectional view of a first casing) of a mobile phone shown in FIG. 11.
Figure 13:
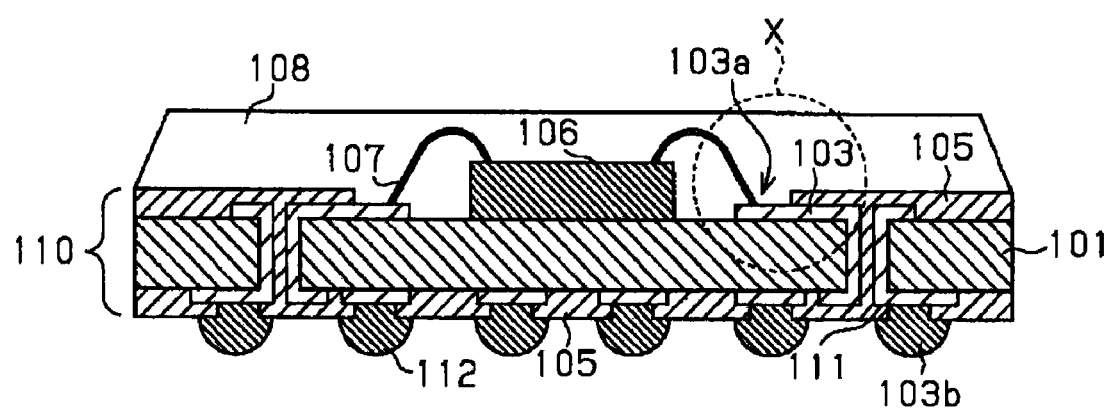
FIG. 13 is a schematic cross-sectional view of a conventional BGA-type semiconductor device.
Figure 14:
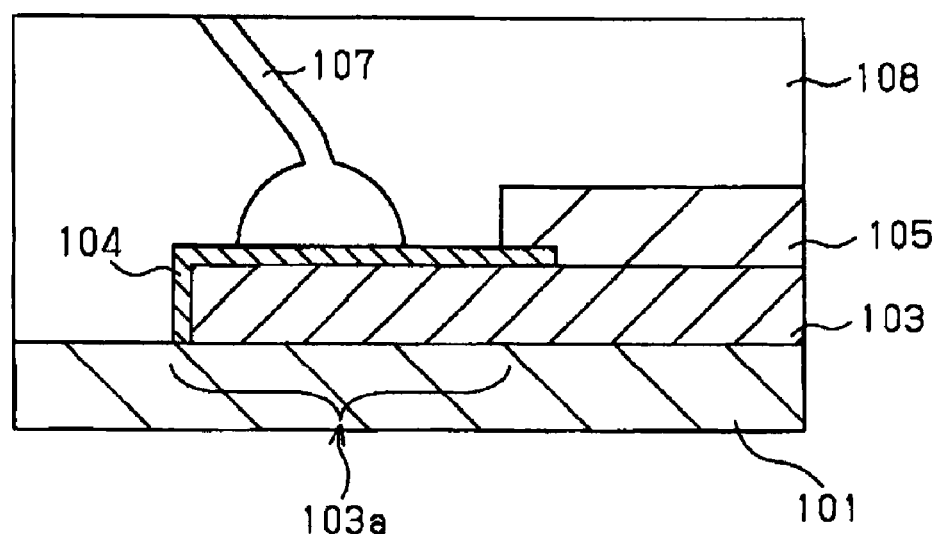
FIG. 14 is an enlarged cross-sectional view of a pad electrode portion of a semiconductor device shown in FIG. 13.

FIG. 12 is a partial cross-sectional view (cross-sectional view of the first casing 212) of the mobile phone shown in FIG. 11. A semiconductor module 130 according to each of the embodiments is mounted on a printed circuit board 228 via external connection electrodes 290, and is coupled electrically to a display unit 218 and the like by way of the printed circuit board 228. Also, a radiating substrate 216, such as a metal substrate, is provided on the back side of the semiconductor module 130 (opposite side of external connection electrodes 290), so that the heat generated from the semiconductor module 130, for example, can be efficiently released outside the first casing 112 without getting trapped therein.

The following advantageous effects are produced by the mobile apparatus provided with the semiconductor module according to the fifth embodiment:

(10) The supply (spread) of moisture to the wiring pattern 2 is restricted in the pad electrode portion. This makes ion migration between wiring patterns harder to occur. Consequently, the connection reliability of the semiconductor module 130 can be improved. As a result, the reliability of the mobile apparatus with such a semiconductor module 130 mounted thereon is improved.

(11) The semiconductor module 130 manufactured by a wafer-level CSP (Chip Size Package) as described in the above embodiments is made thinner and smaller. Hence, the mobile apparatus that mounts such a semiconductor module 130 can be madder thinner and smaller.

While the preferred embodiments of the present invention have been described using specific terms, such description is for illustrative purposes only, and it is to be understood that changes and variations may be made without departing from the spirit or scope of the appended claims.

What is claimed:

1. A method for manufacturing a packaging board adapted to mount an electronic device, the method comprising:
    a process of forming a first metal layer on a substrate;
    a process of forming a wiring having an electrode region, a wiring region and a boundary region provided between the electrode region and the wiring region, by patterning the first metal layer;
    a process of forming a second metal layer on a surface of the wiring and the substrate;
    a process of forming a mask on the substrate in a manner such that the second metal layer is partially exposed on the electrode region, the boundary region and a predetermined region in the periphery of the electrode region and the boundary region;
    a process of making a surface of the boundary region lower than that of the wiring region, using the first mask, by removing the wiring layer corresponding to the electrode region and the boundary region after selectively removing the second metal layer in the electrode region, the boundary region and the predetermined region in the periphery of the electrode region and the boundary region by use of the first mask;
    a process of removing the first mask;
    a process of forming a second mask on the substrate in a manner such that the wiring in the electrode region and the substrate in a predetermined region in the periphery of the electrode region are exposed;
    a process of forming a gold plating layer in the electrode region with the second metal layer used as a lead;
    a process of removing the second mask and the second metal layer; and
    a process of covering part of the electrode region and the wiring layer in the boundary region and the wiring region with an insulating layer.

2. A method for manufacturing a packaging board according to claim 1, wherein the first metal layer is formed by using an electroless plating method and an electrolytic plating method.

3. A method for manufacturing a packaging board according to claim 1, wherein the second metal layer is formed by using an electroless plating method.

4. A method for manufacturing a packaging board according to claim 1, wherein the gold plating layer is an Au/Ni layer or an Au/Pd/Ni layer.

5. A method for manufacturing a packaging board according to claim 1, further comprising a process of roughening a surface of the wiring after forming the wiring.

6. A method for manufacturing a packaging board according to claim 1, wherein the insulating layer is formed after providing a gap between the wiring and the substrate along edges of a bottom of the wiring in an area where the insulating layer is covered.

* * * * *